(12) United States Patent
Li

(10) Patent No.: US 12,349,466 B2
(45) Date of Patent: Jul. 1, 2025

(54) DISPLAY PANEL AND METHOD FOR FABRICATING SAME

(71) Applicant: TCL CHINA STAR OPTOELECTRONICS TECHNOLOGY CO., LTD., Shenzhen (CN)

(72) Inventor: Lixia Li, Shenzhen (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/769,748

(22) PCT Filed: Apr. 13, 2022

(86) PCT No.: PCT/CN2022/086564
§ 371 (c)(1),
(2) Date: Apr. 17, 2022

(87) PCT Pub. No.: WO2023/184574
PCT Pub. Date: Oct. 5, 2023

(65) Prior Publication Data
US 2024/0178234 A1 May 30, 2024

(30) Foreign Application Priority Data
Apr. 2, 2022 (CN) .......................... 202210350182.X

(51) Int. Cl.
H10D 86/60 (2025.01)
G02F 1/1335 (2006.01)
(Continued)

(52) U.S. Cl.
CPC ......... H10D 86/60 (2025.01); H10D 86/0231 (2025.01); H10D 86/441 (2025.01); *G02F 1/133512* (2013.01); *G02F 1/1368* (2013.01)

(58) Field of Classification Search
CPC ............. G02F 1/133512; G02F 1/1368; H01L 27/124; H01L 27/1288
See application file for complete search history.

(56) References Cited

U.S. PATENT DOCUMENTS

2002/0135709 A1 9/2002 Sung Chae
2004/0155244 A1* 8/2004 Kawata ............. H01L 29/78633
257/E27.113

(Continued)

FOREIGN PATENT DOCUMENTS

CN 101017291 A 8/2007
CN 103809317 A 5/2014
(Continued)

OTHER PUBLICATIONS

International Search Report in International application No. PCT/CN2022/086564, mailed on Dec. 19, 2022.
(Continued)

*Primary Examiner* — Dung T Nguyen
*Assistant Examiner* — David Y Chung
(74) *Attorney, Agent, or Firm* — PV IP PC; Wei Te Chung

(57) ABSTRACT

A display panel includes a first substrate and a second substrate disposed opposite to each other and spaced apart from each other, and a second semiconductor layer. The first substrate includes a first base substrate, a first metal layer, a first semiconductor layer, and a second metal layer. The first metal layer is disposed on the first base substrate. The first semiconductor layer is disposed on the first metal layer. The second metal layer is disposed on the first semiconductor (Continued)

layer. The second substrate includes a second base substrate and a third metal layer. The third metal layer is disposed on the second base substrate. The second semiconductor layer is disposed between the first metal layer and the third metal layer. The first semiconductor layer is insulated from the second semiconductor layer.

16 Claims, 7 Drawing Sheets

(51) Int. Cl.
    *G02F 1/1368*     (2006.01)
    *H10D 86/01*     (2025.01)
    *H10D 86/40*     (2025.01)

(56) References Cited

U.S. PATENT DOCUMENTS

| | | | |
|---|---|---|---|
| 2012/0033161 A1* | 2/2012 | Han | H01L 27/1214 257/53 |
| 2017/0315392 A1* | 11/2017 | Noh | G02F 1/1368 |
| 2018/0067368 A1 | 3/2018 | Izawa et al. | |
| 2020/0301185 A1* | 9/2020 | Huang | G02F 1/136277 |

FOREIGN PATENT DOCUMENTS

| | | |
|---|---|---|
| CN | 106200177 A | 12/2016 |
| CN | 106847829 A | 6/2017 |
| CN | 109273458 A | 1/2019 |
| CN | 109557735 A | 4/2019 |
| CN | 109856870 A | 6/2019 |
| CN | 209014875 U | 6/2019 |
| CN | 110262145 A | 9/2019 |
| CN | 110620119 A | 12/2019 |
| CN | 113097227 A | 7/2021 |
| CN | 113454783 A | 9/2021 |
| CN | 115362561 A | 11/2022 |
| TW | 200408874 A | 6/2004 |

OTHER PUBLICATIONS

Written Opinion of the International Search Authority in International application No. PCT/CN2022/086564, mailed on Dec. 19, 2022.

Chinese Office Action issued in corresponding Chinese Patent Application No. 202210350182.X dated Jun. 15, 2023, pp. 1-7.

* cited by examiner

DISPLAY PANEL AND METHOD FOR FABRICATING SAME

FIELD OF INVENTION

The present disclosure relates to the technical field of display, and particularly to a display panel and a method for fabricating the same.

BACKGROUND

Crosstalk is a relatively common phenomenon in poor display of thin film transistor liquid crystal display devices, which means that a picture in a certain area will affect pictures in other areas. In a current thin film transistor liquid crystal display device, due to capacitive coupling between data lines and common electrodes, horizontal crosstalk is prone to occur.

Specifically, when a potential of a data line changes, an instantaneous potential jump is formed on a common electrode through a parasitic capacitance between the data line and the common electrode. If signal delay of the common electrode is serious, or a voltage driving capability of the common electrode is insufficient, the potential cannot quickly return to a preset potential. This potential jump will pull down a voltage across pixels through a coupling effect of storage capacitors, resulting in a decrease in pixel brightness and formation of horizontal crosstalk.

In the current thin film transistor liquid crystal display device, a parasitic capacitance structure between the data lines and the common electrodes comprises a semiconductor layer and an insulating layer, resulting in a difference in size of a parasitic capacitance during positive frame driving and negative frame driving. Therefore, capacitive coupling effects of left and right data lines on one common electrode are quite different, thereby causing horizontal crosstalk.

SUMMARY OF DISCLOSURE

The present disclosure provides a display panel and a method for fabricating the same, which can solve a problem of horizontal crosstalk caused by capacitive coupling between a data line and a common electrode.

In one aspect, the present disclosure provides a display panel, which comprises a first substrate and a second substrate disposed opposite to each other and spaced apart from each other, and a second semiconductor layer. The first substrate comprises a first base substrate, a first metal layer, a first semiconductor layer, and a second metal layer. The first metal layer is disposed on the first base substrate. The first semiconductor layer is disposed on the first metal layer. The second metal layer is disposed on the first semiconductor layer. The second substrate comprises a second base substrate and a third metal layer. The third metal layer is disposed on the second base substrate. The second semiconductor layer is disposed between the first metal layer and the third metal layer. The first semiconductor layer is insulated from the second semiconductor layer.

Optionally, in some embodiments, the first semiconductor layer and the second semiconductor layer have a same thickness.

Optionally, in some embodiments, the first substrate further comprises an insulating layer. The first metal layer is disposed on the first base substrate. The insulating layer is disposed on the first metal layer. The first semiconductor layer is disposed on the insulating layer. The second metal layer is disposed on the first semiconductor layer. The first semiconductor layer and the second semiconductor layer are made of a same type of material, and the first semiconductor layer is made of a P-type semiconductor material or an N-type semiconductor material.

Optionally, in some embodiments, the second semiconductor layer is disposed between the first metal layer and the insulating layer.

Optionally, in some embodiments, the second semiconductor layer is disposed on a side of the third metal layer away from the second base substrate.

Optionally, in some embodiments, the second semiconductor layer is disposed on a side of the second metal layer away from the first base substrate.

Optionally, in some embodiments, one of the first semiconductor layer and the second semiconductor layer is made of a P-type semiconductor material and the other one is made of an N-type semiconductor material.

Optionally, in some embodiments, the first substrate further comprises a thin film transistor and a data line. The thin film transistor comprises a gate electrode, a source electrode, and a drain electrode. The gate electrode is included in the first metal layer. The source electrode, the drain electrode, and the data line are included in the second metal layer.

Optionally, in some embodiments, the second substrate further comprises a light shielding layer and a planarization layer. The light shielding layer is disposed on a side of the second base substrate close to the first base substrate. The third metal layer is disposed on the light shielding layer. The second semiconductor layer is disposed on the third metal layer. The planarization layer is disposed on the second semiconductor layer.

In another aspect, the present disclosure further provides a method for fabricating a display panel, which comprises: forming a first metal layer on a first base substrate; forming a first semiconductor layer and a second metal layer on the first metal layer to obtain a first substrate; forming a third metal layer on a second base substrate to obtain a second substrate; and forming a second semiconductor layer between the first metal layer and the third metal layer, wherein the second semiconductor layer is insulated from the first semiconductor layer.

Optionally, in some embodiments, the first semiconductor layer and the second semiconductor layer have a same thickness.

Optionally, in some embodiments, the first substrate further comprises an insulating layer. The first metal layer is disposed on the first base substrate. The insulating layer is disposed on the first metal layer. The first semiconductor layer is disposed on the insulating layer. The second metal layer is disposed on the first semiconductor layer. The first semiconductor layer and the second semiconductor layer are made of a same type of material, and the first semiconductor layer is made of a P-type semiconductor material or an N-type semiconductor material.

Optionally, in some embodiments, the second semiconductor layer is disposed between the first metal layer and the insulating layer.

Optionally, in some embodiments, the second semiconductor layer is disposed on a side of the third metal layer away from the second base substrate.

Optionally, in some embodiments, the second semiconductor layer is disposed on a side of the second metal layer away from the first base substrate.

Optionally, in some embodiments, one of the first semiconductor layer and the second semiconductor layer is made of a P-type semiconductor material and the other one is made of an N-type semiconductor material.

Optionally, in some embodiments, the forming the second semiconductor layer between the first metal layer and the third metal layer comprises: forming the second semiconductor layer on the first metal layer; forming a photoresist layer on the second semiconductor layer; patterning the photoresist layer to form a photoresist pattern; dry etching the second semiconductor layer by using the photoresist pattern as a mask to expose a part of the first metal layer; and wet etching the first metal layer to form a common electrode and a gate electrode.

Optionally, in some embodiments, the first substrate further comprises a thin film transistor and a data line. The thin film transistor comprises a gate electrode, a source electrode, and a drain electrode. The gate electrode is included in the first metal layer. The source electrode, the drain electrode, and the data line are included in the second metal layer.

Optionally, in some embodiments, the second substrate further comprises a light shielding layer and a planarization layer. The light shielding layer is disposed on a side of the second base substrate close to the first base substrate. The third metal layer is disposed on the light shielding layer. The second semiconductor layer is disposed on the third metal layer. The planarization layer is disposed on the second semiconductor layer.

Optionally, in some embodiments, a thickness of the planarization layer is same as a thickness of the insulating layer.

The present disclosure provides a display panel and a method for fabricating the same. The display panel comprises a first substrate and a second substrate disposed opposite to each other and spaced apart from each other. The first substrate comprises a first base substrate, a first metal layer, a first semiconductor layer, and a second metal layer. The first metal layer is disposed on the first base substrate. The first semiconductor layer is disposed on the first metal layer. The second metal layer is disposed on the first semiconductor layer. The second substrate comprises a second base substrate and a third metal layer. The third metal layer is disposed on the second base substrate. The display panel further comprises a second semiconductor layer. The second semiconductor layer is disposed between the first metal layer and the third metal layer. The first semiconductor layer is insulated from the second semiconductor layer. In the display panel of the present disclosure, the second semiconductor layer is disposed between the first metal layer and the third metal layer to offset a parasitic capacitance between a data line and a common electrode, thereby solving a problem of horizontal crosstalk caused by capacitive coupling between the data line and the common electrode.

BRIEF DESCRIPTION OF DRAWINGS

In order to more clearly illustrate technical solutions in embodiments of the present disclosure, a brief description of accompanying drawings used in a description of the embodiments will be given below. The accompanying drawings in the following description are merely some embodiments of the present disclosure. For those skilled in the art, other drawings may be obtained from these accompanying drawings without creative labor.

DETAILED DESCRIPTION

Technical solutions in embodiments of the present disclosure will be clearly and completely described below in conjunction with accompanying drawings in the embodiments of the present disclosure. It is apparent that the described embodiments are merely some of the embodiments of the present disclosure and not all embodiments. All other embodiments obtained by those skilled in the art based on the embodiments of the present disclosure without creative labor are within claimed scope of the present disclosure.

The present disclosure provides a display panel and a method for fabricating the same, which can solve a problem of horizontal crosstalk caused by capacitive coupling between a data line and a common electrode and will be described in detail below. It should be noted that a description order of the following embodiments is not intended to limit a preferred order of the embodiments. Furthermore, in a description of the present disclosure, the term "comprising" means "comprising but not limited to". The terms "first", "second", "third", and the like are used merely as labels to distinguish different objects, rather than to describe a particular order.

Figure 1A:
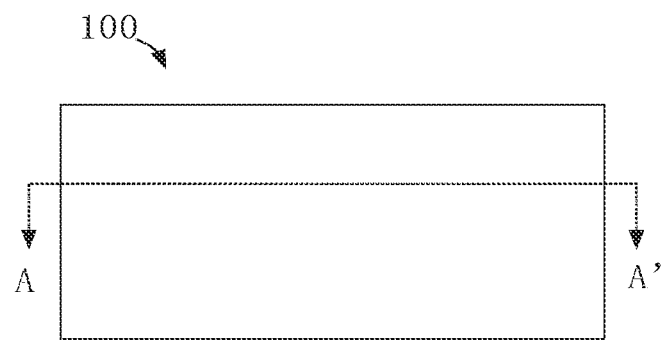
FIG. 1*a* is a top view of a display panel according to a first embodiment of the present disclosure.
Figure 1B:
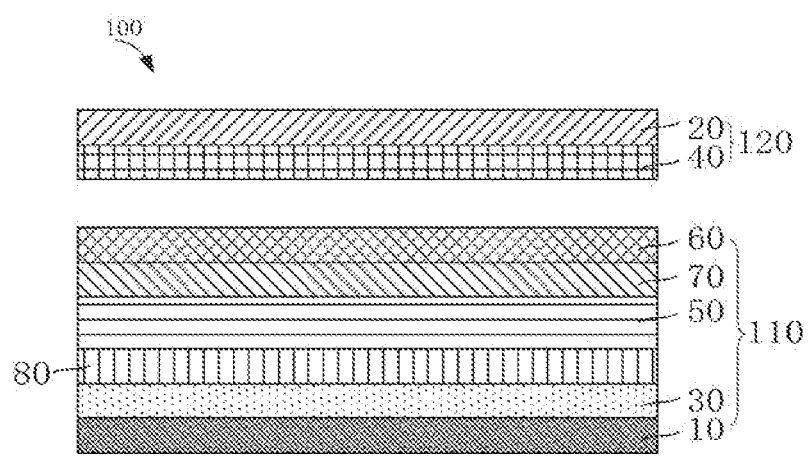
FIG. 1*b* is a cross-sectional view of the display panel of FIG. 1*a* along a line A-A'.
Figure 2A:
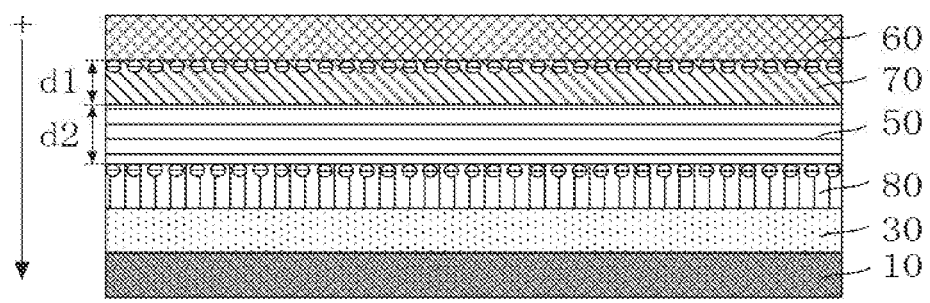
FIG. 2*a* is a schematic diagram of cooperation of a first semiconductor layer and a second semiconductor layer in a positive frame in the first embodiment.
Figure 2B:
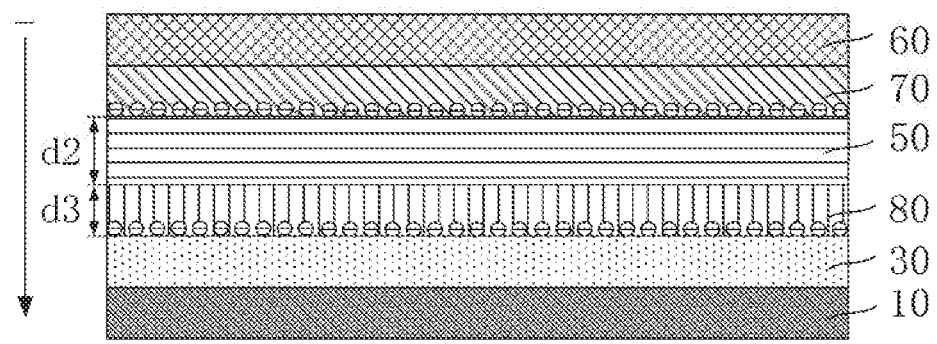
FIG. 2*b* is a schematic diagram of the cooperation of the first semiconductor layer and the second semiconductor layer in a negative frame in the first embodiment.

Please refer to FIG. 1*a* to FIG. 2*b*. FIG. 1*a* is a top view of a display panel 100 according to a first embodiment of the present disclosure. FIG. 1*b* is a cross-sectional view of the display panel 100 of FIG. 1*a* along a line A-A'. FIG. 2*a* is a schematic diagram of cooperation of a first semiconductor layer 70 and a second semiconductor layer 80 in a positive frame in the first embodiment. FIG. 2*b* is a schematic diagram of the cooperation of the first semiconductor layer 70 and the second semiconductor layer 80 in a negative frame in the first embodiment. As shown in FIG. 1*a* and FIG. 1*b*, the present disclosure provides a display panel 100 comprising a first substrate 110, a second substrate 102, and a second semiconductor layer 80. Specifically, the first substrate 110 comprises a first base substrate 10, a first metal layer 30 disposed on the first base substrate 10, a first semiconductor layer 70 disposed on the first metal layer 30, and a second metal layer 60 disposed on the first semiconductor layer 70. The second substrate 120 is disposed opposite to and is spaced apart from the first substrate 110. The second substrate 120 comprises a second base substrate 20 and a third metal layer 40 disposed on the second base substrate 20. The second semiconductor layer 80 is disposed between the first metal layer 30 and the third metal layer 40. The first semiconductor layer 70 is insulated from the second semiconductor layer 80.

In an embodiment of the present disclosure, the second semiconductor layer 80 is disposed between the first metal layer 30 and the third metal layer 40 to offset a parasitic capacitance between the first metal layer 30 and the third metal layer 40, thereby solving a problem of horizontal crosstalk caused by capacitive coupling between the first metal layer 30 and the third metal layer 40.

In an embodiment of the present disclosure, the first substrate 110 further comprises an insulating layer 50. The first metal layer 30 is disposed on the first base substrate 10. The insulating layer 50 is disposed on the first metal layer 30. The first semiconductor layer 70 is disposed on the insulating layer 50. The second metal layer 60 is disposed on the first semiconductor layer 70.

In an embodiment of the present disclosure, the second semiconductor layer 80 is disposed between the first metal layer 30 and the insulating layer 50. The first substrate 10 and the second substrate 20 may be glass substrates, silicon oxide substrates, or the like. The insulating layer 50 may be a silicon nitride layer, a silicon dioxide layer, or a laminate of silicon nitride and silicon dioxide, or may be made of benzocyclohutene or acryl resin, but is not limited thereto.

In an embodiment of the present disclosure, the first substrate 110 further comprises a thin film transistor (not shown). The thin film transistor comprises a gate electrode, a source electrode, and a drain electrode. The gate electrode is included in the first metal layer 30. The source electrode and the drain electrode are included in the second metal layer 60.

Specifically, the first metal layer 30 further includes a common electrode. The second metal layer 60 further includes a data line. The data line may be a single-layer film made of aluminum-neodymium alloy, aluminum, copper, molybdenum, molybdenum-tungsten alloy, or chromium, or a composite film composed of any combination of these metal materials.

In an embodiment of the present disclosure, a thickness of the first semiconductor layer 70 and a thickness of the second semiconductor layer 80 are same. It should be noted that the thickness of the first semiconductor layer 70 and the thickness of the second semiconductor layer 80 may be different, and those skilled in the art can adjust them according to actual needs, which are not limited in the present disclosure.

In an embodiment of the present disclosure, specifically, the first semiconductor layer 70 and the second semiconductor layer 80 are made of a same type of material. The first semiconductor layer is made of a P-type semiconductor material or an N-type semiconductor material, and the second semiconductor layer is also made of the P-type semiconductor material or the N-type semiconductor material. The P-type semiconductor material contains a higher concentration of "holes". The N-type semiconductor material contains a high concentration of "electrons".

According to a capacitance formula $C=\varepsilon S/4\pi kd$, it can be known that a size of a capacitance value C is negatively correlated with a distance d between the first metal layer 30 and the second metal layer 60. In an embodiment of the present disclosure, the first semiconductor layer 70 has a thickness $d1$, the insulating layer 50 has a thickness $d2$, and the second semiconductor layer 80 has a thickness $d3$. The first semiconductor layer 70 and the second semiconductor layer 80 are made of the N-type semiconductor material. As shown in FIG. 2a, during a positive frame driving, "electrons" in the first semiconductor layer 70 and the second semiconductor layer 80 are located on a side away from the first base substrate 10, and thus, $C_1=\varepsilon S/4\pi k$ $(d1+d2)$. As shown in FIG. 2b, during a negative frame driving, the "electrons" in the first semiconductor layer 70 and the second semiconductor layer 80 are located on a side close to the first base substrate 10, and thus, $C_2=\varepsilon S/4\pi k$ $(d2+d3)$. Preferably, the thickness $d1$ of the first semiconductor layer 70 and the thickness $d3$ of the second semiconductor layer 80 are same, that is, $d1=d3$, and thus $C_1=C_2$. That is, by arranging the second semiconductor layer 80 with a thickness equal to the thickness of the first semiconductor layer 70 between the first metal layer 30 and the insulating layer 50, parasitic capacitances during the positive frame driving and the negative frame driving are equal in size, so as to offset a parasitic capacitance between the data line and the first metal layer 30, thereby solving a problem of horizontal crosstalk caused by capacitive coupling between the data line and the common electrode.

Figure 3:
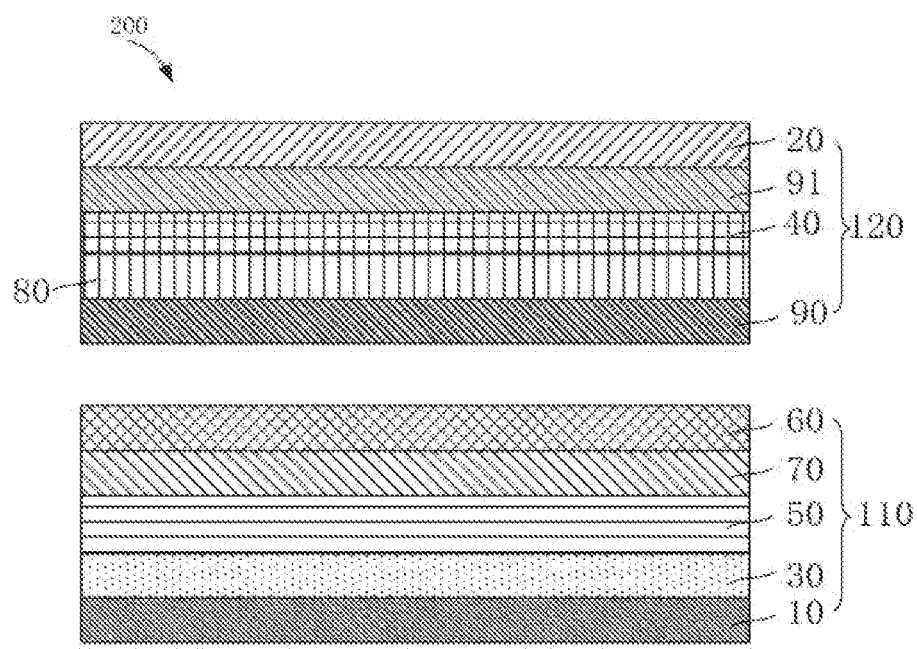
FIG. 3 is a cross-sectional view of a display panel according to a second embodiment of the present disclosure.
Figure 4A:
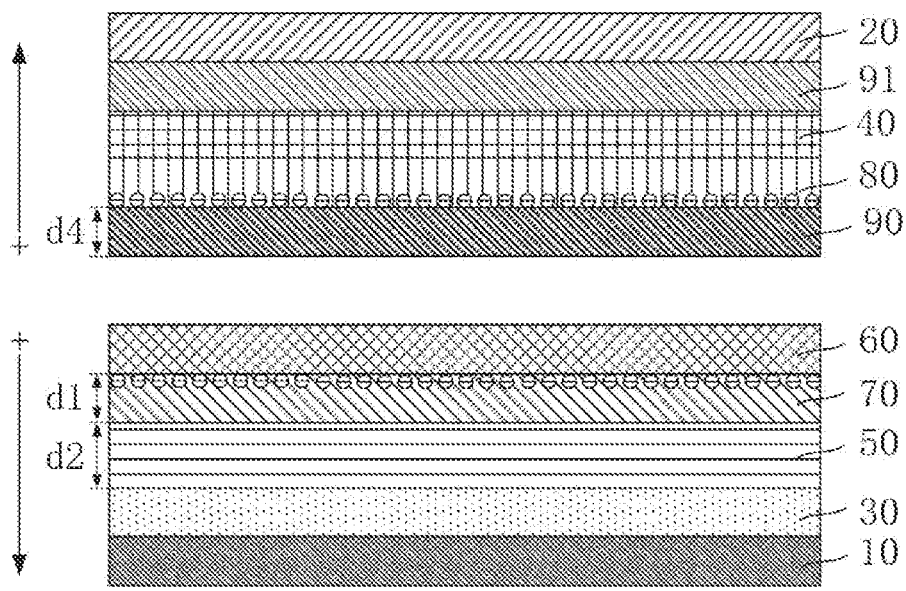
FIG. 4*a* is a schematic diagram of cooperation of a first semiconductor layer and a second semiconductor layer in a positive frame in the second embodiment.
Figure 4B:
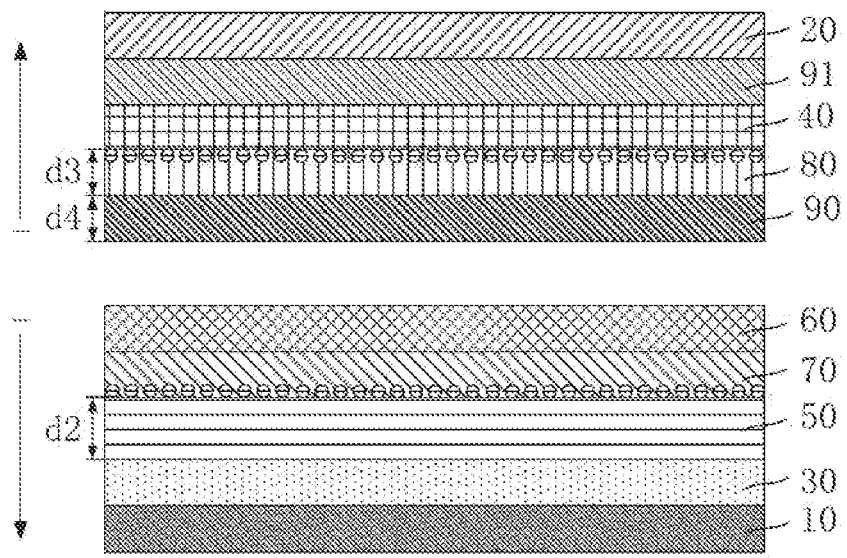
FIG. 4*b* is a schematic diagram of the cooperation of the first semiconductor layer and the second semiconductor layer in a negative frame in the second embodiment.

The present disclosure provides a specific embodiment, please refer to FIG. 3, FIG. 4a, and FIG. 4b. FIG. 3 is a cross-sectional view of a display panel 200 according to a second embodiment of the present disclosure. FIG. 4a is a schematic diagram of cooperation of a first semiconductor layer 70 and a second semiconductor layer 80 in a positive frame in the second embodiment. FIG. 4b is a schematic diagram of the cooperation of the first semiconductor layer 70 and the second semiconductor layer 80 in a negative frame in the second embodiment. As shown in FIG. 3, the present disclosure further provides a display panel 200. The display panel 200 differs from the display panel 100 in that the second semiconductor layer 80 is disposed on a side of the third metal layer 40 away from the second base substrate 20.

In an embodiment of the present disclosure, the display panel 200 comprises a first substrate 110, a second substrate 102, and a second semiconductor layer 80. Specifically, the first substrate 110 comprises a first base substrate 10, a first metal layer 30 disposed on the first base substrate 10, a first semiconductor layer 70 disposed on the first metal layer 30, and a second metal layer 60 disposed on the first semiconductor layer 70. The second substrate 120 is disposed opposite to and is spaced apart from the first substrate 110. The second substrate 120 comprises a second base substrate 20 and a third metal layer 40 disposed on the second base substrate 20. The second semiconductor layer 80 is disposed between the first metal layer 30 and the third metal layer 40. The first semiconductor layer 70 is insulated from the second semiconductor layer 80.

In an embodiment of the present disclosure, the first substrate 110 further comprises an insulating layer 50. The first metal layer 30 is disposed on the first base substrate 10. The insulating layer 50 is disposed on the first metal layer 30. The first semiconductor layer 70 is disposed on the insulating layer 50. The second metal layer 60 is disposed on the first semiconductor layer 70.

In an embodiment of the present disclosure, the first substrate 110 further comprises a thin film transistor (not shown). The thin film transistor comprises a gate electrode, a source electrode, and a drain electrode. The gate electrode is included in the first metal layer 30. The source electrode and the drain electrode are included in the second metal layer 60. Specifically, the first metal layer 30 further includes a common electrode. The second metal layer 60 further includes a data line. The data line may be a single-layer film made of aluminum-neodymium alloy, aluminum, copper, molybdenum, molybdenum-tungsten alloy, or chromium, or a composite film composed of any combination of these metal materials.

In an embodiment of the present disclosure, the display panel 200 further comprises a light shielding layer 91 and a planarization layer 90. The light shielding layer 91 is disposed on a side of the second base substrate 20 close to the first base substrate 10. The third metal layer 40 is disposed on the light shielding layer 91. The second semiconductor layer 80 is disposed on the third metal layer 40. The planarization layer 90 is disposed on the second semiconductor layer 80.

In an embodiment of the present disclosure, a thickness of the first semiconductor layer 70 and a thickness of the second semiconductor layer 80 are same. It should be noted that the thickness of the first semiconductor layer 70 and the thickness of the second semiconductor layer 80 may be different, and those skilled in the art can adjust them according to actual needs, which are not limited in the present disclosure.

In an embodiment of the present disclosure, specifically, the first semiconductor layer 70 and the second semiconductor layer 80 are made of a same type of material. The first semiconductor layer is made of a P-type semiconductor material or an N-type semiconductor material, and the second semiconductor layer is also made of the P-type semiconductor material or the N-type semiconductor material. The P-type semiconductor material contains a higher concentration of "holes". The N-type semiconductor material contains a high concentration of "electrons".

According to the capacitance formula $C=\varepsilon S/4\pi kd$, it can be known that a size of a capacitance value C is negatively correlated with a distance d between two metal electrode plates. In an embodiment of the present disclosure, the first semiconductor layer 70 has a thickness d1, the insulating layer 50 has a thickness d2, the second semiconductor layer 80 has a thickness d3, and the planarization layer 90 has a thickness d4, wherein d1=d3 and d2=d4. The first semiconductor layer 70 and the second semiconductor layer 80 are made of the N-type semiconductor material.

As shown in FIG. 4a, during a positive frame driving, "electrons" in the first semiconductor layer 70 are located on a side away from the first base substrate 10, so that a parasitic capacitance of a capacitance structure composed of the first metal layer 30 and the data line of the second metal layer 60 is $C_{10}=\varepsilon S/4\pi k$ (d1+d2). And, "electrons" in the second semiconductor layer 80 are located on a side away from the second base substrate 20, so that a parasitic capacitance of a capacitance structure composed of the third metal layer 40 and the data line of the second metal layer 60 is $C_{20}=\varepsilon S/4\pi kd4$. At this time, the parasitic capacitance $C_{20}$ between the third metal layer 40 and the data line of the second metal layer 60 is greater than the parasitic capacitance $C_{10}$ between the first metal layer 30 and the data line of the second metal layer 60.

As shown in FIG. 4b, during a negative frame driving, the "electrons" in the first semiconductor layer 70 are located on a side close to the first base substrate 10, so that the parasitic capacitance of the capacitance structure composed of the first metal layer 30 and the data line of the second metal layer 60 is $C_{30}=\varepsilon S/4\pi kd2$. And, the "electrons" in the second semiconductor layer 80 are located on a side close to the second base substrate 20, so that the parasitic capacitance of the capacitance structure composed of the third metal layer 40 and the data line of the second metal layer 60 is $C_{40}=\varepsilon S/4\pi k$ (d3+d4). At this time, the parasitic capacitance $C_{40}$ between the third metal layer 40 and the data line of the second metal layer 60 is less than the parasitic capacitance $C_{30}$ between the first metal layer 30 and the data line of the second metal layer 60.

By arranging the second semiconductor layer 80 between the third metal layer 40 and the second metal layer 60, during the positive frame driving and the negative frame driving, a sum of the parasitic capacitances between the first metal layer 30 and the data line of the second metal layer 60 is equal to a sum of the parasitic capacitances between the third metal layer 40 and the data line of the second metal layer 60, so as to offset the parasitic capacitance between the data line and the first metal layer 30 and the parasitic capacitance between the data line and the third metal layer 40, thereby solving a problem of horizontal crosstalk caused by capacitive coupling between the data line and the first metal layer 30 and capacitive coupling between the data line and the third metal layer 40.

Figure 5:
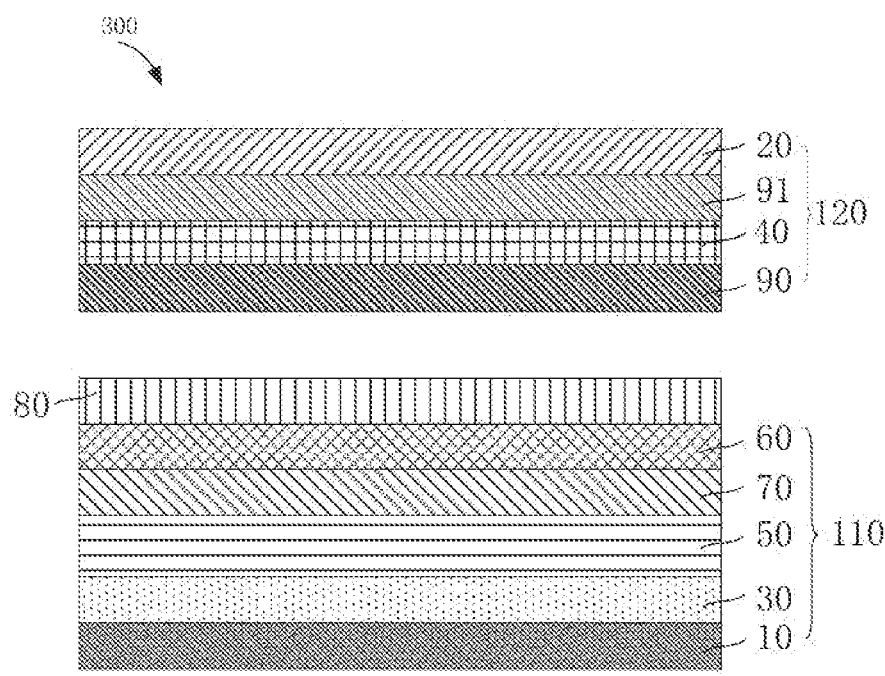
FIG. 5 is a cross-sectional view of a display panel according to a third embodiment of the present disclosure.
Figure 6A:
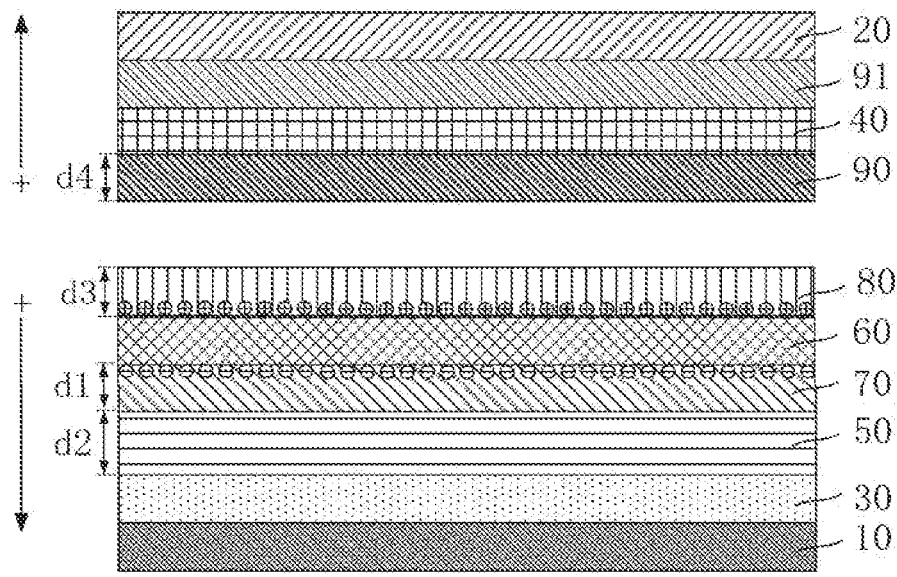
FIG. 6*a* is a schematic diagram of cooperation of a first semiconductor layer and a second semiconductor layer in a positive frame in the third embodiment.
Figure 6B:
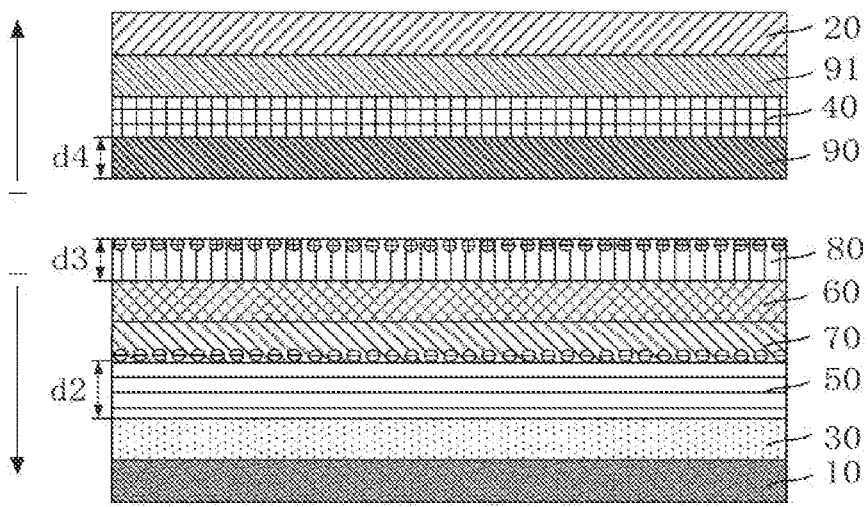
FIG. 6*b* is a schematic diagram of the cooperation of the first semiconductor layer and the second semiconductor layer in a negative frame in the third embodiment.

The present disclosure further provides a specific embodiment, please refer to FIG. 5. FIG. 6a, and FIG. 6b. FIG. 5 is a cross-sectional view of a display panel 300 according to a third embodiment of the present disclosure. FIG. 6a is a schematic diagram of cooperation of a first semiconductor layer 70 and a second semiconductor layer 80 in a positive frame in the third embodiment. FIG. 6b is a schematic diagram of the cooperation of the first semiconductor layer 70 and the second semiconductor layer 80 in a negative frame in the third embodiment. As shown in FIG. 5, the present disclosure further provides a display panel 300. The display panel 300 differs from the display panel 100 in that the second semiconductor layer 80 is disposed on a side of the second metal layer 60 away from the first base substrate 10.

In an embodiment of the present disclosure, one of the first semiconductor layer 70 and the second semiconductor layer 80 is made of a P-type semiconductor material and the other one is made of an N-type semiconductor material. Specifically, the first semiconductor layer 70 is made of the N-type semiconductor material, and the second semiconductor layer 80 is made of the P-type semiconductor material.

In an embodiment of the present disclosure, the display panel 300 comprises a first substrate 110, a second substrate 102, and a second semiconductor layer 80. Specifically, the first substrate 110 comprises a first base substrate 10, a first metal layer 30 disposed on the first base substrate 10, a first semiconductor layer 70 disposed on the first metal layer 30, and a second metal layer 60 disposed on the first semiconductor layer 70. The second substrate 120 is disposed opposite to and is spaced apart from the first substrate 110. The second substrate 120 comprises a second base substrate 20 and a third metal layer 40 disposed on the second base substrate 20. The second semiconductor layer 80 is disposed between the first metal layer 30 and the third metal layer 40. The first semiconductor layer 70 is insulated from the second semiconductor layer 80.

In an embodiment of the present disclosure, the first substrate 110 further comprises an insulating layer 50. The first metal layer 30 is disposed on the first base substrate 10. The insulating layer 50 is disposed on the first metal layer 30. The first semiconductor layer 70 is disposed on the insulating layer 50. The second metal layer 60 is disposed on the first semiconductor layer 70.

In an embodiment of the present disclosure, the first substrate 110 further comprises a thin film transistor (not shown). The thin film transistor comprises a gate electrode, a source electrode, and a drain electrode. The gate electrode is included in the first metal layer 30. The source electrode and the drain electrode are included in the second metal layer 60. Specifically, the first metal layer 30 further includes a common electrode. The second metal layer 60 further includes a data line. The data line may be a single-layer film made of aluminum-neodymium alloy, aluminum, copper, molybdenum, molybdenum-tungsten alloy, or chromium, or a composite film composed of any combination of these metal materials.

In an embodiment of the present disclosure, the display panel 200 further comprises a light shielding layer 91 and a planarization layer 90. The light shielding layer 91 is disposed on a side of the second base substrate 20 close to the first base substrate 10. The third metal layer 40 is disposed on the light shielding layer 91. The second semiconductor layer 80 is disposed on the third metal layer 40. The planarization layer 90 is disposed on the second semiconductor layer 80.

In an embodiment of the present disclosure, a thickness of the first semiconductor layer 70 and a thickness of the second semiconductor layer 80 are same. It should be noted that the thickness of the first semiconductor layer 70 and the thickness of the second semiconductor layer 80 may be different, and those skilled in the art can adjust them according to actual needs, which are not limited in the present disclosure.

The P-type semiconductor material contains a higher concentration of "holes". The N-type semiconductor material contains a high concentration of "electrons".

According to the capacitance formula $C=\varepsilon S/4\pi kd$, it can be known that a size of a capacitance value C is negatively correlated with a distance d between two metal electrode plates. In an embodiment of the present disclosure, the first semiconductor layer 70 has a thickness $d1$, the insulating layer 50 has a thickness $d2$, the second semiconductor layer 80 has a thickness $d3$, and the planarization layer 90 has a thickness $d4$, wherein $d1=d3$ and $d2=d4$.

As shown in FIG. 6a, during a positive frame driving, "electrons" in the first semiconductor layer 70 are located on a side away from the first base substrate 10, so that a parasitic capacitance of a capacitance structure composed of the first metal layer 30 and the data line of the second metal layer 60 is $C_{10}=\varepsilon S/4\pi k (d1+d2)$. And, "holes" in the second semiconductor layer 80 are located on a side close to the first base substrate 10, so that a parasitic capacitance of a capacitance structure composed of the third metal layer 40 and the data line of the second metal layer 60 is $C_{10}=\varepsilon S/4\pi k (d3+d4)$. At this time, the parasitic capacitance $C_{20}$ between the third metal layer 40 and the data line of the second metal layer 60 is equal to the parasitic capacitance $C_{10}$ between the first metal layer 30 and the data line of the second metal layer 60.

As shown in FIG. 6b, during a negative frame driving, the "electrons" in the first semiconductor layer 70 are located on the side close to the first base substrate 10, so that the parasitic capacitance of the capacitance structure composed of the first metal layer 30 and the data line of the second metal layer 60 is $C_{30}=\varepsilon S/4\pi kd2$. And, the "holes" in the second semiconductor layer 80 are located on the side-elesete away from the first base substrate 10, so that the parasitic capacitance of the capacitance structure composed of the third metal layer 40 and the data line of the second metal layer 60 is $C_{40}=\varepsilon S/4\pi kd4$. At this time, the parasitic capacitance $C_{40}$ between the third metal layer 40 and the data line of the second metal layer 60 is less-than equal to the parasitic capacitance $C_{30}$ between the first metal layer 30 and the data line of the second metal layer 60.

By arranging the second semiconductor layer 80 on the side of the second metal layer 60 away from the first base substrate 10, during the positive frame driving and the negative frame driving, the parasitic capacitances between the first metal layer 30 and the data line of the second metal layer 60 are equal to the parasitic capacitances between the third metal layer 40 and the data line of the second metal layer 60, so as to offset the parasitic capacitance between the data line and the first metal layer 30 and the parasitic capacitance between the data line and the third metal layer 40, thereby solving a problem of horizontal crosstalk caused by capacitive coupling between the data line and the first metal layer 30 and capacitive coupling between the data line and the third metal layer 40.

Figure 7:
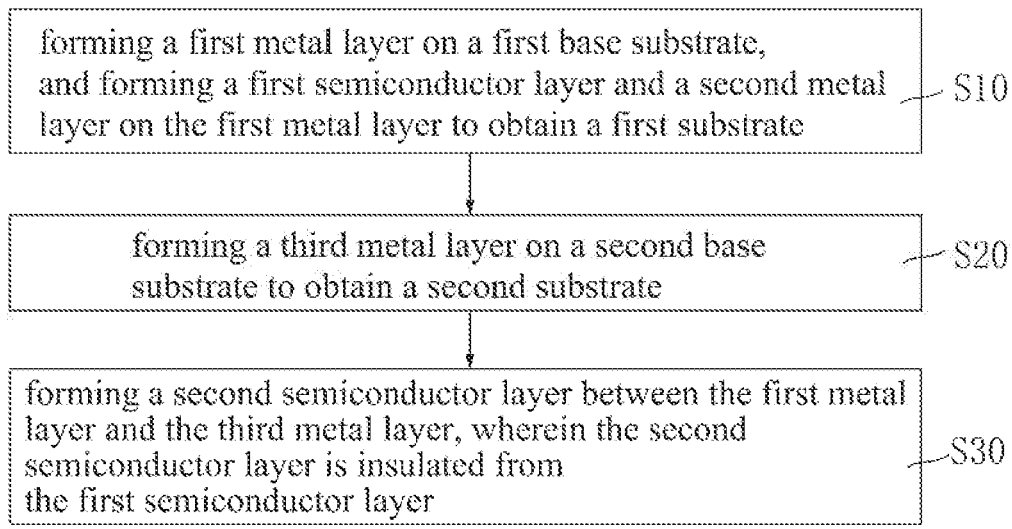
FIG. 7 is a schematic flowchart of a method for fabricating a display panel according to an embodiment of the present disclosure.

In another aspect, please refer to FIG. 7, which is a schematic flowchart of a method for fabricating a display panel according to an embodiment of the present disclosure. As shown in FIG. 7, the present disclosure further provides a method for fabricating a display panel, which comprises the following steps.

S10: forming a first metal layer 30 on a first base substrate 10, and forming a first semiconductor layer 70 and a second metal layer 60 on the first metal layer 30 to obtain a first substrate 110.

In an embodiment of the present disclosure, an insulating layer 50 is formed on the first metal layer 30, the first semiconductor layer 70 is formed on the insulating layer 50, and the second metal layer 60 is formed on the first semiconductor layer 70.

In an embodiment of the present disclosure, the first metal layer 30 is formed on the first base substrate 10 and comprises gate electrodes and scan lines. Each of the scan lines is electrically connected to corresponding gate electrodes. The gate electrodes may be provided independently or may be part of the scan lines. The gate electrodes may be made of polysilicon. The first semiconductor layer 70 may be an amorphous silicon semiconductor layer, an N-type polysilicon layer, or a P-type polysilicon layer. The insulating layer 50 may be a silicon nitride layer, a silicon dioxide layer, or a laminate of silicon nitride and silicon dioxide, or may be made of benzocyclohutene or acryl resin, but is not limited thereto. The second metal layer 60 may be made of a metal with low resistivity such as aluminum-neodymium alloy, aluminum, copper, molybdenum, molybdenum-tungsten alloy, or chromium, or an alloy containing any of these materials, or other composite film. The second metal layer 60 comprises source electrodes, drain electrodes, and data lines. One source electrode and one drain electrode are respectively connected to two ends of one active layer. Each of the data lines is connected to corresponding source electrodes. Each of the source electrodes together with one corresponding drain electrode and one corresponding gate electrode form one thin film transistor.

In an embodiment of the present disclosure, a second semiconductor layer 80 is formed on the first metal layer 30, and a photoresist layer is formed on the second semiconductor layer 80. The photoresist layer is patterned to form a photoresist pattern. The second semiconductor layer 80 is dry etched by using the photoresist pattern as a mask to expose a part of the first metal layer 30, and the first metal layer 30 is wet etched to form a common electrode and a gate electrode.

S20: forming a third metal layer 40 on a second base substrate 20 to obtain a second substrate 120.

S30: forming a second semiconductor layer 80 between the first metal layer 30 and the third metal layer 40, wherein the second semiconductor layer 80 is insulated from the first semiconductor layer 70.

Specifically, when the first semiconductor layer 70 and the second semiconductor layer 80 are both made of a P-type semiconductor material or an N-type semiconductor material, the second semiconductor layer 80 may be disposed between the first metal layer 30 and the insulating layer 50, or on a side of the third metal layer 40 away from the second base substrate 20.

When one of the first semiconductor layer 70 and the second semiconductor layer 80 is made of a P-type semiconductor material and the other one is made of an N-type semiconductor material, the second semiconductor layer 80 is disposed on a side of the second metal layer 60 away from the first base substrate 10.

The present disclosure provides a display panel and a method for fabricating the same. In the display panel, the second semiconductor layer 80 is disposed between the first metal layer 30 and the third metal layer 40 to offset a parasitic capacitance between one data line and one common electrode, thereby solving a problem of horizontal crosstalk caused by capacitive coupling between the data line and the common electrode.

The display panel may be any product or component with display function, such as an electronic paper, a mobile phone, a tablet computer, a television, a monitor, a notebook computer, a digital photo frame, or a navigator.

The display panel and the method for fabricating the same provided by the embodiments of the present disclosure are described in detail above. The present disclosure uses specific examples to describe principles and embodiments of the present invention. The above description of the embodiments is only for helping to understand the solutions of the present disclosure and its core ideas. Furthermore, those skilled in the art may make modifications to the specific embodiments and applications according to ideas of the present invention. In conclusion, the present specification should not be construed as a limitation to the present invention.

What is claimed is:

1. A display panel, comprising:
    a first substrate comprising:
        a first base substrate;
        a first metal layer disposed on the first base substrate and comprising a common electrode;
        a first semiconductor layer disposed on the first metal layer;
        a second metal layer disposed on the first semiconductor layer and comprising a data line;
    a second substrate disposed opposite to and spaced apart from the first substrate and comprising:
        a second base substrate; and
        a third metal layer disposed on the second base substrate; and
    a second semiconductor layer disposed between the first metal layer and the third metal layer and insulated from the first semiconductor layer;
    wherein the first semiconductor layer and the second semiconductor layer have a same thickness;
    wherein the first substrate further comprises a thin film transistor and a data line, the thin film transistor comprises a gate electrode, a source electrode, and a drain electrode, the gate electrode is included in the first metal layer, and the source electrode, the drain electrode, and the data line are included in the second metal layer.

2. The display panel according to claim 1, wherein the first substrate further comprises an insulating layer, the first metal layer is disposed on the first base substrate, the insulating layer is disposed on the first metal layer, the first semiconductor layer is disposed on the insulating layer, the second metal layer is disposed on the first semiconductor layer, the first semiconductor layer and the second semiconductor layer are made of a same type of material, and the first semiconductor layer is made of a P-type semiconductor material or an N-type semiconductor material.

3. The display panel according to claim 1, wherein the first substrate further comprises an insulating layer, and the second semiconductor layer is disposed between the first metal layer and the insulating layer.

4. The display panel according to claim 2, wherein the second semiconductor layer is disposed on a side of the third metal layer away from the second base substrate.

5. The display panel according to claim 1, wherein the second semiconductor layer is disposed on a side of the second metal layer away from the first base substrate.

6. The display panel according to claim 5, wherein one of the first semiconductor layer and the second semiconductor layer is made of a P-type semiconductor material and the other one is made of an N-type semiconductor material.

7. The display panel according to claim 1, wherein the second substrate further comprises a light shielding layer and a planarization layer, the light shielding layer is disposed on a side of the second base substrate close to the first base substrate, the third metal layer is disposed on the light shielding layer, the second semiconductor layer is disposed on the third metal layer, and the planarization layer is disposed on the second semiconductor layer.

8. A method for fabricating a display panel, comprising:
    forming a first metal layer on a first base substrate and comprising a common electrode;
    forming a first semiconductor layer and a second metal layer on the first metal layer to obtain a first substrate;
    forming a third metal layer on a second base substrate to obtain a second substrate; and
    forming a second semiconductor layer between the first metal layer and the third metal layer, wherein the second semiconductor layer is insulated from the first semiconductor layer;
    wherein the first semiconductor layer and the second semiconductor layer have a same thickness;
    wherein the first substrate further comprises a thin film transistor and a data line, the thin film transistor comprises a gate electrode, a source electrode, and a drain electrode, the gate electrode is included in the first metal layer, and the source electrode, the drain electrode, and the data line are included in the second metal layer.

9. The method for fabricating the display panel according to claim 8, wherein the first substrate further comprises an insulating layer, the first metal layer is disposed on the first base substrate, the insulating layer is disposed on the first metal layer, the first semiconductor layer is disposed on the insulating layer, the second metal layer is disposed on the first semiconductor layer, the first semiconductor layer and the second semiconductor layer are made of a same type of material, and the first semiconductor layer is made of a P-type semiconductor material or an N-type semiconductor material.

10. The method for fabricating the display panel according to claim 8, wherein the first substrate further comprises an insulating layer, and the second semiconductor layer is disposed between the first metal layer and the insulating layer.

11. The method for fabricating the display panel according to claim 9, wherein the second semiconductor layer is disposed on a side of the third metal layer away from the second base substrate.

12. The method for fabricating the display panel according to claim 8, wherein the second semiconductor layer is disposed on a side of the second metal layer away from the first base substrate.

13. The method for fabricating the display panel according to claim 12, wherein one of the first semiconductor layer and the second semiconductor layer is made of a P-type semiconductor material and the other one is made of an N-type semiconductor material.

14. The method for fabricating the display panel according to claim 8, wherein the forming the second semiconductor layer between the first metal layer and the third metal layer comprises:

forming the second semiconductor layer on the first metal layer;

forming a photoresist layer on the second semiconductor layer;

patterning the photoresist layer to form a photoresist pattern;

dry etching the second semiconductor layer by using the photoresist pattern as a mask to expose a part of the first metal layer; and wet etching the first metal layer to form the common electrode and a gate electrode.

15. The method for fabricating the display panel according to claim 9, wherein the second substrate further comprises a light shielding layer and a planarization layer, the light shielding layer is disposed on a side of the second base substrate close to the first base substrate, the third metal layer is disposed on the light shielding layer, the second semiconductor layer is disposed on the third metal layer, and the planarization layer is disposed on the second semiconductor layer.

16. The method for fabricating the display panel according to claim 15, wherein a thickness of the planarization layer is same as a thickness of the insulating layer.

* * * * *